United States Patent [19]
Onishi

[11] Patent Number: 5,856,693
[45] Date of Patent: Jan. 5, 1999

[54] SEMICONDUCTOR INTEGRATED CIRCUIT DEVICE CONTAINING MOS PROTECTION CIRCUIT

[75] Inventor: Hideaki Onishi, Tokyo, Japan

[73] Assignee: NEC Corporation, Tokyo, Japan

[21] Appl. No.: 516,929

[22] Filed: Aug. 18, 1995

[30] Foreign Application Priority Data

Aug. 18, 1994 [JP] Japan .................................. 6-216551

[51] Int. Cl.⁶ ............................. H01L 29/78; H01L 23/62
[52] U.S. Cl. ........................ 257/336; 257/344; 257/355; 257/382
[58] Field of Search ..................... 257/336, 344, 257/408, 382, 383, 355, 360, 377

[56] References Cited

U.S. PATENT DOCUMENTS

| | | | |
|---|---|---|---|
| 5,142,345 | 8/1992 | Miyata ................................. | 375/23.13 |
| 5,202,576 | 4/1993 | Liu et al. ............................... | 257/344 |
| 5,215,936 | 6/1993 | Kinugawa ............................. | 437/44 |
| 5,281,841 | 1/1994 | Van Roosendaal et al. .......... | 257/360 |
| 5,436,482 | 7/1995 | Ogoh .................................... | 257/344 |
| 5,563,438 | 10/1996 | Tsang .................................... | 257/355 |
| 5,578,509 | 11/1996 | Fujita .................................... | 437/35 |
| 5,585,658 | 12/1996 | Mukai et al. .......................... | 257/344 |

FOREIGN PATENT DOCUMENTS

| | | | |
|---|---|---|---|
| 62-001275 | 1/1987 | Japan .................................. | 257/408 |
| 2-158143 | 6/1990 | Japan .................................. | 257/344 |
| 3-106074 | 5/1991 | Japan .................................. | 257/336 |
| 5-343670 | 12/1993 | Japan .................................. | 257/335 |

OTHER PUBLICATIONS

T.L. Polgreen et al., "Improving the ESD Failure Threshold of Silicided n–MOS Output Transistors by Ensuring Uniform Current Flow", *IEEE Transactions on Electronic Devices*, vol. 39, No. 2, Feb. 1992, pp. 379–388.

*Primary Examiner*—Jerome Jackson, Jr.
*Assistant Examiner*—David B. Hardy
*Attorney, Agent, or Firm*—Sughrue, Mion, Zinn, Macpeak & Seas, PLLC

[57] ABSTRACT

A semiconductor integrated circuit device containing a protection MOSFET. This MOSFET has source and drain regions and a channel region formed in a semiconductor substrate. The channel region is disposed between the source and drain regions. The source region is made of a first lightly doped region and a first heavily doped region. The first lightly doped region is adjacent to a first end of the channel region. The drain region is made of a second lightly doped region and a second heavily doped region. The second lightly doped region is adjacent to a second end of the channel region. The second end of the channel region is positioned on an opposite side to that of the first end. A distance from the second end of the channel region to an opposing end of the second heavily doped region is longer than a distance from the first end of the channel region to an opposing end of the first heavily doped region. Even if the snapback voltage of the MOSFET fluctuates from place to place in the same MOSFET, the snapback phenomenon tends to occur within the entire drain region almost simultaneously, enabling to improve the ESD breakdown resistance of the protection MOSFET.

16 Claims, 7 Drawing Sheets

SEMICONDUCTOR INTEGRATED CIRCUIT DEVICE CONTAINING MOS PROTECTION CIRCUIT

BACKGROUND OF THE INVENTION

1. Field of the Invention

The present invention relates to a semiconductor integrated circuit device and more particularly, to a semiconductor integrated circuit device containing a protection circuit that is composed of at least one Metal-Oxide-Semiconductor Field-Effect Transistor (MOSFET) with the Lightly Doped Drain (LDD) structure.

2. Description of the Prior Art

Recently, a semiconductor integrated circuit device has been becoming denser and electronic components provided therein have been becoming finer. In response to this trend, impurity-doped regions such as source/drain regions of an MOSFET have been formed shallower within a semiconductor layer or substrate, making the sheet resistance of the impurity-doped regions higher. Such the high sheet resistance of the impurity-doped regions affects the operation of the component including the regions and as a result, some problems occur regarding their high-speed operation occur.

To cope with the above problems, a sheet-resistance reduction technique has been developed and used practically, in which the surface areas of the silicon impurity-doped regions are silicided to form refractory-metal silicide layers on the respective impurity-doped regions.

Figure 1:
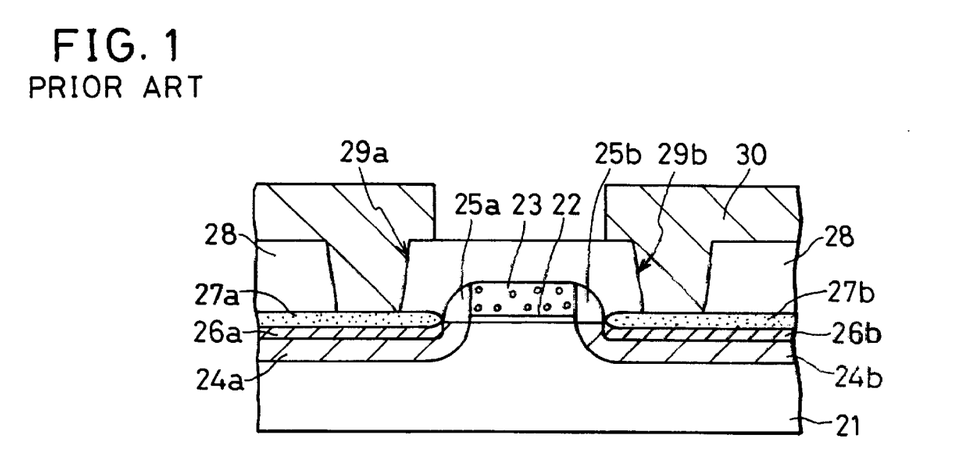
FIG. 1 is a partial cross-sectional view of a protection MOSFET provided in a conventional semiconductor integrated circuit device.

FIG. 1 shows a partial cross section of an MOSFET provided in a conventional semiconductor integrated circuit device, which is produced by using the conventional sheet-resistance reduction technique.

As shown in FIG. 1, a gate oxide layer 22 is selectively formed on a p-silicon substrtate 21. A gate electrode 23 made of a conductive material such as polysilicon is selectively formed on the gate oxide layer 22. Sidewall spacers 25a and 25b are formed on the substrate 21 at each side of the gate electrode 23.

On one side of the gate electrode 23, an n⁻-diffusion region 24a that is lightly doped with an n-impurity and an n⁺-diffusion region 26a that is heavily doped with an n-impurity are formed in the surface area of the substrate 21. The n⁻-diffusion region 24a extends to an opposing end of the gate electrode 23. The n⁺-diffusion region 26a extends to the outer end of the sidewall spacer 25a and is placed on the region 24a. The diffusion regions 24a and 26a constitute a source region of an MOSFET.

On the other side of the gate electrode 23, an n⁻-diffusion region 24b that is lightly doped with an n-impurity and an n⁺-diffusion region 26b that is heavily doped with an n-impurity are formed in the surface area of the substrate 21. The n⁻-diffusion region 24b extends to an opposing end of the gate electrode 23. The n⁺-diffusion region 26b extends to the outer end of the sidewall spacer 25b and is placed on the region 24b. The diffusion regions 24b and 26b constitute a drain region of the MOSFET.

To reduce the sheet resistance of the source and drain regions, refractory-metal silicide layers 27a and 27b are formed on the n⁺-diffusion regions 26a and 26b, respectively. The silicide layer 27a is placed on the entire region 26a and the silicide layer 27b is placed on the entire region 26b.

An interlayer insulator film 28 is formed over the substrate 21 to cover the MOSFET. A patterned interconnection film 30 made of aluminum or the like is formed on the interlayer insulator film 28. The interconnection film 30 is contacted with the silicide layer 27a of the source region through contact holes 29a formed in the film 28 to be electrically interconnected with the source region. The interconnection film 30 is contacted with the silicide layer 27b of the drain region also through contact holes 29b formed in the film 28 to be electrically interconnected with the drain region.

Thus, the MOSFET employs the LDD structure and the above sheet-resistance reduction technique.

Typically, a semiconductor integrated circuit device includes internal circuits for producing specified functions, and input/output (I/O) circuits through which input signals are supplied into the internal circuits and output signals are derived therefrom. Also, the I/O circuits typically contain protection circuits to protect the internal circuits from the electrostatic discharge (ESD).

With a conventional MOS semiconductor integrated circuit device, a plurality of MOSFETs having the structure of FIG. 1 are employed in not only the internal circuits and the I/O circuits but also the protection circuits. When the MOSFET of FIG. 1 is employed in the protection circuit, in other words, it is used as a protection transistor, since the protection MOSFET has the silicide layers 27a and 27b on the source and drain regions 24a and 24b, the protection MOSFET has a lower resistance of the source and drain regions than the case of no such silicide layers. As a result, the conventional protection MOSFET exhibits a V-I characteristic as shown by the curve O-A-B-C in FIG. 2.

Figure 2:
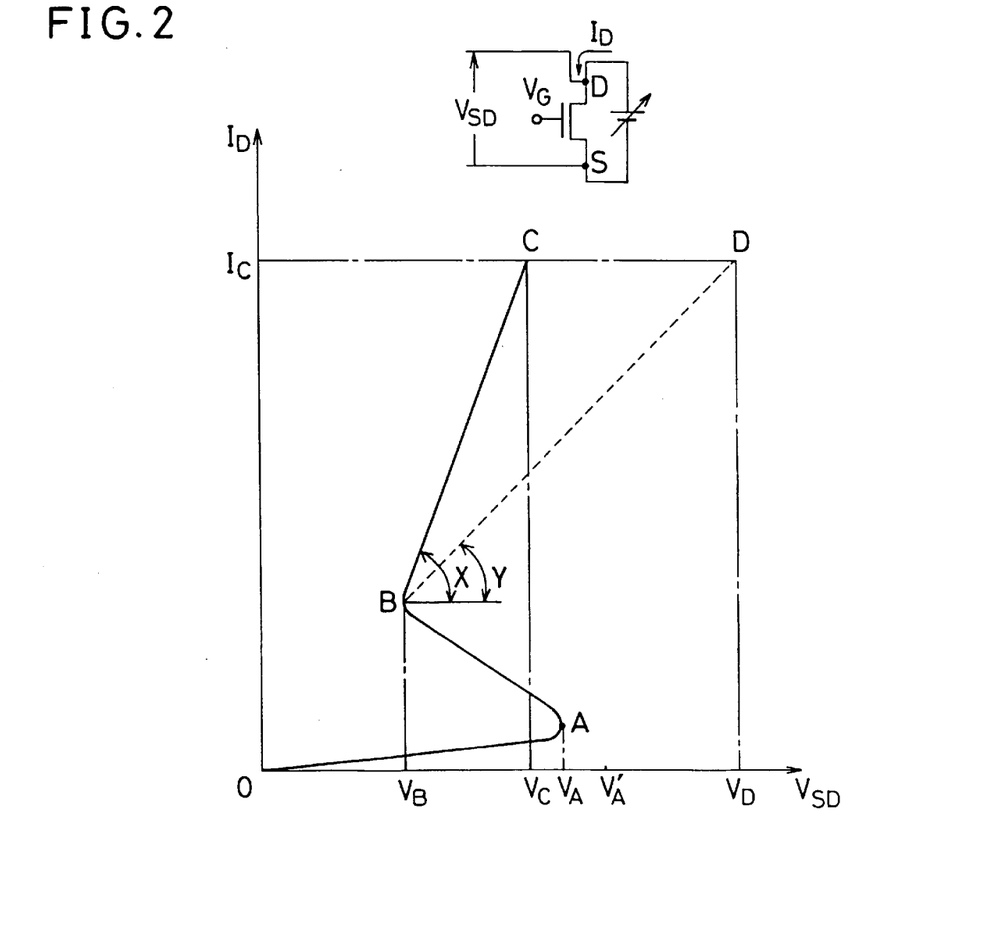
FIG. 2 is a graph showing a relationship between the source-drain voltage and the drain current of the MOSFET.

Specifically, when the gate electrode 23 is applied with a constant voltage of $V_G$, the relationship between the drain current $I_D$ and the source-drain voltage $V_{SD}$ is expressed by the curve O-A-B-C. Within the "normal operation region" between the points O and A, the drain current $I_D$ increases linearly and gradually from the point O to the point A together with the increasing source-drain voltage $V_{SD}$. At the point A ($V_{SD}=V_A$), the source-drain voltage $V_{SD}$ starts to decrease in spite of the increase of the drain current $I_D$. The region from the point A to the point B is the "snapback region" in which the MOSFET exhibits a negative resistance characteristic.

At the point B ($V_{SD}=V_B>V_A$), the source-drain voltage $V_{SD}$ starts to increase again toward the point C together with the increase of the drain current $I_D$. The region from the point B to the point C is the "breakdown region". At the point C ($V_{SD}=V_C, I_D=I_C$) the p-n junction of the drain region is electrostatically broken or damaged, which means damage to the MOSFET.

The snapback voltage $V_{SD}$ is shown as $V_A$ in FIG. 2. However, the voltage $V_{SB}$ tends to vary from place to place within the same MOSFET due to the fluctuation in fabrication. For example, $V_{SB}=V_A$ in one place and $V_{SB}=V_A'$ in another place where $V_A<V_A'$.

If $V_C<V_A$ as shown in FIG. 2, even if the snapback phenomenon occurs in the place where $V_{SB}=V_A$, the snapback phenomenon does not occur in the place where $V_{SB}=V_A'$. Therefore, the drain current $I_D$ flows through only the snapbacked place where $V_{SB}=V_A$ and as a result, the p-n junction is damaged partially in the snapbacked place, leading to damage of the MOSFET itself. This means the decrease in the substantial breakdown voltage.

SUMMARY OF THE INVENTION

Accordingly, an object of the present invention is to provide a semiconductor integrated circuit device that enables to improve the ESD breakdown resistance of its protection MOSFET.

A semiconductor integrated circuit device according to the present invention contains a protection MOSFFT with the LDD structure. The protection MOSFET has source and drain regions and a channel region formed in a semiconductor substrate. The channel region is disposed between the source and drain regions. The source region is made of a first lightly doped region and a first heavily doped region. The first lightly doped region is adjacent to a first end of the channel region. The drain region is made of a second lightly doped region and a second heavily doped region. The second lightly doped region is adjacent to a second end of the channel region. The second end of the channel region is positioned on an opposite side to that of the first end.

A distance from the second end of the channel region to an opposing end of the second heavily doped region is longer than a distance from the first end of the channel region to an opposing end of the first heavily doped region.

With the device according to the present invention, the distance from the first end of the channel region to the opposing end of the second heavily doped region is longer than the distance from the second end of the channel region to the opposing end of the first heavily doped region. Therefore, the resistance of the drain region is greater than that of the source region, increasing the breakdown voltage of the protection MOSFET.

As a result, even if the snapback voltage of the MOSFET fluctuates or varies from place to place in the same MOSFET, the snapback phenomenon tends to occur within the entire drain region almost simultaneously. This enables to improve the ESD breakdown resistance of the protection MOSFET.

The second heavily doped region for the drain region may have any plan shape and any layout in consideration with a contact hole or holes provided for the drain region if the distance from the first end of the channel region to the opposing end of the second heavily doped region is longer than the distance from the second end of the channel region to the opposing end of the first heavily doped region.

Preferably, the second heavily doped region is formed only at a position or positions corresponding to the contact hole or holes. In this case, the length of the second heavily doped region in the direction parallel to the channel region may be greater than that of the contact hole or holes by an acceptable placement or stacking error value, or it may be substantially equal to that of the contact hole or holes.

Preferably, the MOSFET further contains a first refractory-metal silicide layer formed to cover the first heavily doped region and a second refractory-metal silicide layer formed to cover the second heavily doped region. The first refractory-metal silicide layer typically covers the entire first heavily doped region. The second refractory-metal silicide layer typically covers the entire second heavily doped region and the exposed second lightly doped region. In this case, an advantage of the reduced resistances of the source and drain regions can be obtained.

DETAILED DESCRIPTION OF THE PREFERRED EMBODIMENTS

Preferred embodiments of the present invention will be described below while referring to the drawings attached.

First Embodiment

Figure 3:
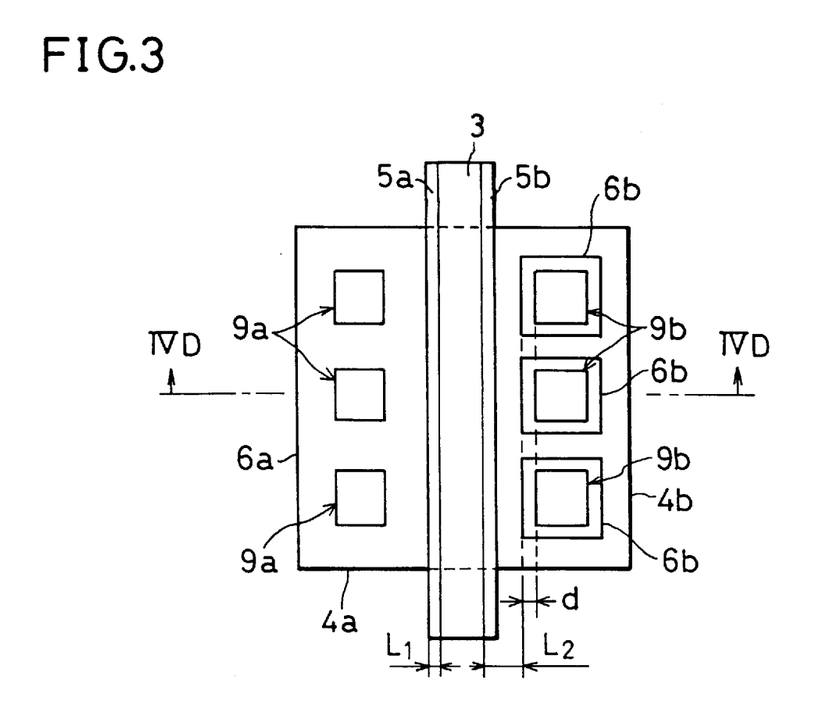
FIG. 3 is a partial plan view of a protection MOSFET of a semiconductor integrated circuit device according to a first embodiment of the invention.
Figure 4A:
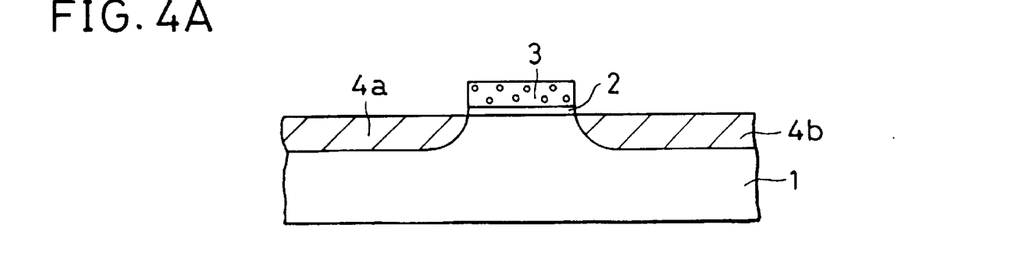
FIGS. 4A to 4D are partial cross-sectional views showing a fabrication method of the protection MOSFET of the semiconductor integrated circuit device according to the first embodiment, respectively.
Figure 4B:
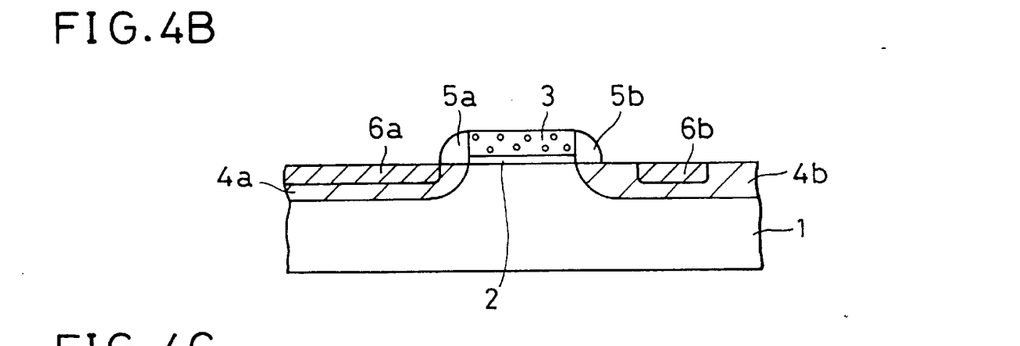
Figure 4C:
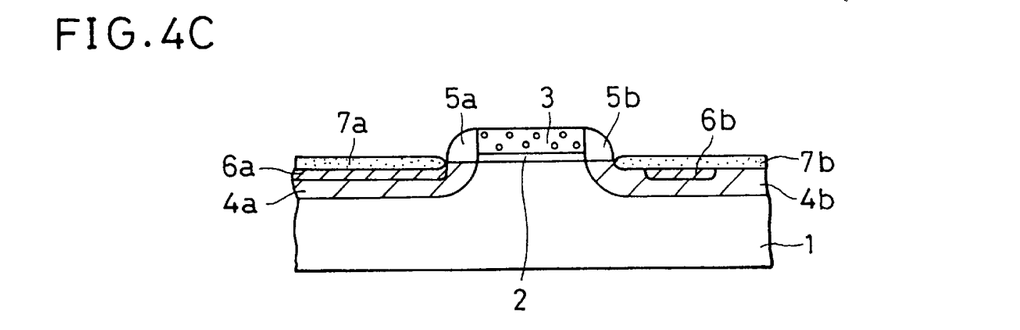
Figure 4D:
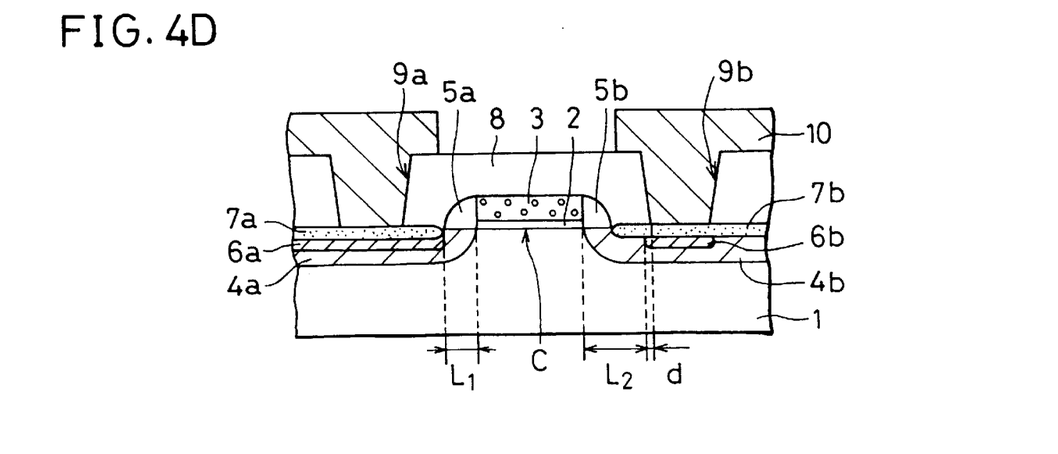

FIGS. 3 and 4D show an n-channel protection MOSFET of a semiconductor integrated circuit device according to a first embodiment, which is produced by using the sheet-resistance reduction technique.

As shown in FIGS. 3 and 4D, a gate oxide layer 2 is selectively formed on a p-silicon substrate 1. A gate electrode 3 made of polysilicon is selectively formed on the gate oxide layer 2. Sidewall spacers 5a and 5b are formed on the substrate 1 at each side of the gate electrode 3.

On one side of the gate electrode 3, an $n^-$-diffusion region 4a that is lightly doped with an n-impurity and an $n^+$-diffusion region 6a that is heavily doped with an n-impurity are formed in the surface area of the substrate 1. The $n^-$-diffusion region 4a extends to an opposing end of the gate electrode 3. The $n^+$-diffusion region 6a extends to the outer end of the sidewall spacer 5a and is placed on the region 4a. The diffusion regions 4a and 6a constitute a source region of an MOSFET.

On the other side of the gate electrode 3, an $n^-$-diffusion region 4b that is lightly doped with an n-impurity and an $n^+$-diffusion region 6b that is heavily doped with an n-impurity are formed in the surface area of the substrate 1. The $n^-$-diffusion region 4b extends to an opposing end of the gate electrode 3. Although the $n^+$-diffusion region 6b is placed on the region 4b, it is apart from the spacer 5b, as shown in FIG. 4D. The diffusion regions 4b and 6b constitute a drain region of the MOSFET.

To reduce the sheet resistance of the source and drain regions, refractory-metal silicide layers 7a and 7b are formed on the $n^+$-diffusion regions 6a and 6b, respectively. The silicide layer 7a is placed on the entire region 6a and the silicide layer 7b is placed on the entire region 6b.

An interlayer insulator film 8 is formed over the substrate 1 to cover the MOSFET. A patterned interconnection film 10 made of aluminum is formed on the interlayer insulator film 8. The interconnection film 10 is contacted with the silicide layer 7a through three contact holes 9a formed in the film 8 to be electrically interconnected with the source region. The interconnection film 10 is contacted with the silicide layer 7b also through three contact holes 9b formed in the film 8 to be electrically interconnected with the drain region.

Thus, the MOSFET employs the LDD structure and the conventional sheet-resistance reduction technique.

As shown in FIG. 3, the MOSFET of the first embodiment is formed in an active region having an approximately square plan shape. Each of the contact holes 9a has an approximately square plan shape and arranged over the source region at regular intervals along the gate electrode 3. Each of the contact holes 9b has an approximately square plan shape and arranged over the drain region at regular intervals along the gate electrode 3.

The $n^+$-diffusion region 6a of the source region is formed on the approximately entire $n^-$-diffusion region 4a. In other words, the region 6a has approximately the same size as that of the region 4a. On the other hand, the $n^+$-diffusion region 6b of the drain region is selectively formed on the parts of the $n^-$-diffusion region 4b right below the respective contact holes 9b. In other words, the region 6b is composed of three island-like parts, each of which has a slightly wider than the corresponding contact hole 9b.

The difference d in size between each island-like part and each hole 9b is provided to compensate the placement or stacking error of the masks used for forming the region 6b and the holes 9b. The difference d is preferably 0.4 $\mu$m or less because the acceptable placement error value typically ranges from 0.25 to 0.3 $\mu$m and a necessary margin of 0.1 $\mu$m is added thereto. More preferably, the difference d is 0.2 $\mu$m or less in consideration with the recent high density of integrated circuits.

A distance L2 from the drain-side end of a channel region of the MOSFET to an opposing end of the $n^+$-diffusion region 6b is longer than a distance L1 from the source-side end of the channel region to an opposing end of the $n^+$-diffusion region 6a.

Next, a fabrication method of the semiconductor integrated circuit device of the first embodiment is described below referring to FIGS. 4A to 4D.

First, as shown in FIG. 4A, a silicon dioxide ($SiO_2$) film of 10 to 20 nm in thickness is selectively formed on the active region of the p-silicon substrate 1 by a thermal oxidation technique. A polysilicon film is then deposited on the $SiO_2$ film by a Chemical Vapor Deposition (CVD) technique using silane as a source gas. The polysilicon film is doped with phosphorus (P) to reduce its resistance. The doped polysilicon film and the $SiO_2$ film are patterned to produce the gate oxide layer 2 and the gate electrode 3.

Next, phosphorus ions are selectively implanted into the active region at an acceleration energy of 20 to 40 keV with a dose of $1.0 \times 10^{13}$ to $5.0 \times 10^{14}$ atoms/cm$^2$ using the gate electrode 3 as a mask. Thus, the $n^-$-diffusion regions 4a and 4b are formed in the active region of the substrate 1 in self-alignment with the gate electrode 3, as shown in FIG. 4A.

An $SiO_2$ film of 150 to 200 nm in thickness is deposited to cover the gate electrode 3 and the diffusion regions 4a and 4b and is etched back, forming the sidewall spacers 5a and 5b. The spacers 5a and 5b are placed on the diffusion regions 4a and 4b and contacted with the opposing side faces of the gate electrode 3, respectively.

A photoresist mask (not shown) is formed to cover the gate electrode 3, the sidewall spacers 5a and 5b and the $n^-$-diffusion regions 4a and 4b, and is patterned to have windows at corresponding positions to the island-like parts of the diffusion region 4b. Arsenic ions (As) are selectively implanted into the $n^-$-diffusion regions 4a and 4b at an acceleration energy of 50 to 70 keV with a dose of $5.0 \times 10^{14}$ to $1.0 \times 10^{16}$ atoms/cm$^2$ using the patterned photoresist mask. Thus, the $n^+$-diffusion regions 6a and 6b are respectively formed in the $n^-$-diffusion regions 4a and 4b in self-alignment with the gate electrode 3 and the sidewall spacers 5a and 5b, as shown in FIG. 4B.

Although the $n^+$-diffusion region 6a is placed on the approximately entire diffusion region 4a, the $n^+$-diffusion region 6a is partially formed on the diffusion region 4b like islands.

Recently, almost all MOS semiconductor integrated circuit devices have had the CMOS structure. In the case of CMOS device, an area of a semiconductor substrate where source and drain regions of p-channel MOSFETs are to be formed needs to be covered with a mask during a process for forming source and drain regions of n-channel MOSFETs. This means that no additional process step is required for the process step of selectively forming the $n^+$-diffusion regions 6b shown in FIG. 2B.

Subsequently, a titanium (Ti) film is selectively deposited on the $n^+$-diffusion regions 6a and 6b and then, the Ti film is subjected to heat treatment. Thus, the silicide layers 7a and 7b made of $TiSi_2$ are formed on the regions 6a and 6b, respectively, as shown in FIG. 4C. During this process, a $TiSi_2$ layer may be additionally formed on the gate electrode 3.

As the silicide layers 7a and 7b, any layer made of a refractory metal silicide such as cobalt silicide ($CoSi_2$) and tungsten silicide ($WSi_2$) may be used.

An insulator film made of BPSG or the like is deposited to cover the MOSFET by a CVD technique, and is patterned to have the contact holes 9a on the silicide layer 7a and the contact holes 9b on the silicide layer 7b, producing the patterned interlayer insulator film 8.

Finally, a conductor film made of aluminum, aluminum alloy or the like is deposited on the patterned interlayer insulator film 8 by a sputtering technique. The conductor film is then patterned by a photolithography technique, forming the patterned interconnection film 10, as shown in FIGS. 4D and 3.

With the n-channel protection MOSFET of FIGS. 3 and 4D, the $n^+$-diffusion region 6b of the drain region is formed like islands, in other words, the region 6b exists only in the connection areas for electrically connecting the drain region with the interconnection layer 10. In the drain region, a current flows from the interconnection layer 10 to the $n^-$-diffusion region 4b through both the silicide layer 7b and the $n^+$-diffusion region 6b. No current flows directly to the diffusion region 4b only through the silicide layer 7b because a potential barrier is produced at the interface of the silicide layer 7b and the $n^-$-diffusion region 4b. Therefore, the resistance of the drain region is greater than that of the source region of this MOSFET. In other words, the drain region of this MOSFET is greater in resistance than that of the conventional MOSFET shown in FIG. 1.

It is known that the slope of the breakdown region of the I-V curve of FIG. 2 is determined by the resistance of the drain region. As described above, the I-V curve of the conventional MOSFET of FIG. 1 has a slope x. On the other hand, the I-V curve of the MOSFET of the first embodiment has a slope y less than x due to the increased drain resistance.

When the gate electrode 3 is applied with a constant voltage of $V_G$, the relationship between the drain current $I_D$ and the source-drain voltage $V_{SD}$ is expressed by the curve O-A-B-D in FIG. 2. Specifically, the $I_D$-$V_{SD}$ curve of the MOSFET of the first embodiment is the same as that of the conventional MOSFET of FIG. 1 within the "normal operation region (OA)" and the "snapback region (AB)". Within the "breakdown region", the drain current $I_D$ and the source-drain voltage $V_{SD}$ vary along the broken line BD having a relatively less slope y due to the reduced drain resistance. Consequently, the breakdown voltage of the MOSFET of the first embodiment increases to $V_D$ where $V_D > V_A > V_C$, which ensures the snapback phenomenon to occur not only in the place where $V_{SB} = V_A$ but also in the place where $V_{SB} = V_A'$.

For this reason, the drain current $I_D$ flows through the entire drain region, improving the ESD breakdown resistance.

The semiconductor integrated circuit device of the first embodiment includes internal circuits for producing specified functions, and input/output (I/O) circuits through which input signals are supplied to the internal circuits. The input circuits each contains at least one protection MOSFET of FIGS. 3 and 4D to protect the corresponding one of the internal circuits from ESD.

Figure 9:
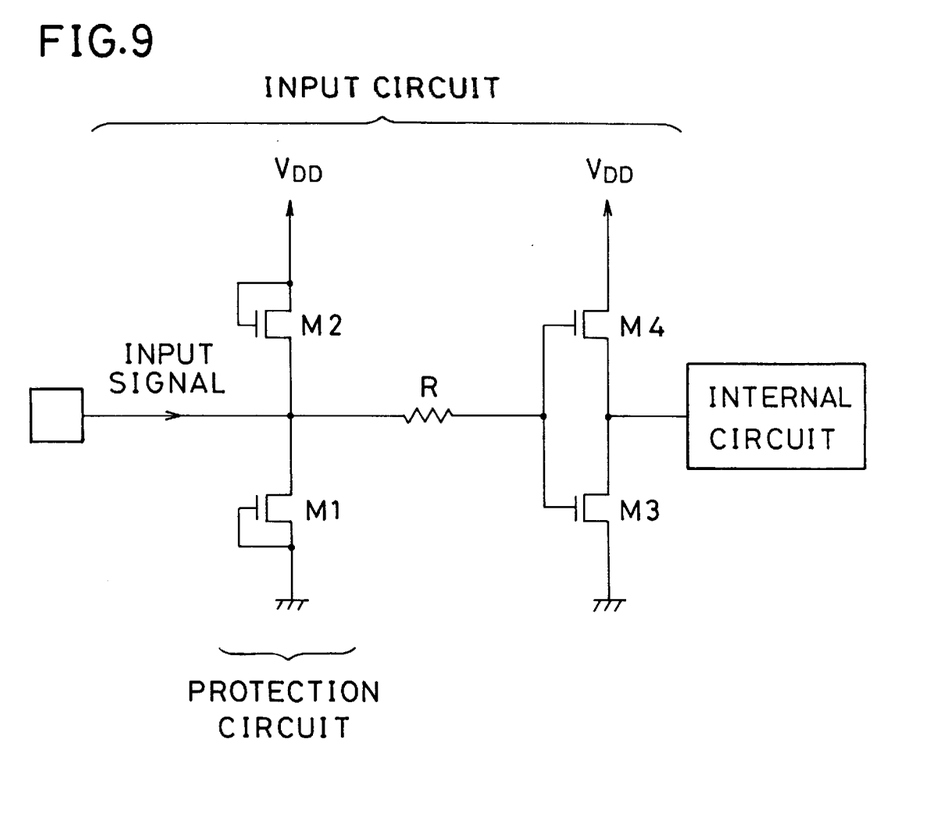
FIG. 9 is a partially and schematic circuit diagram of a semiconductor integrated circuit device, in which any one of the protection MOSFETs according to the first to fourth embodiments is employed.

FIG. 9 shows a part of the semiconductor integrated circuit device of the first embodiment, in which one of the internal circuits and a corresponding one of the input circuits are only shown.

In FIG. 9, M1 denotes an n-channel protection MOSFET and M2 denotes a p-channel protection MOSFET. The MOSFETs M1 and M2 have the structure shown in FIGS. 3 and 4D, respectively. The MOSFET M1 has a gate and a source coupled with each other. The MOSFET M2 also has a gate and a source coupled with each other. Drains of the MOSFETs M1 and M2 are coupled together to be applied with the input signal. A source of the MOSFET M1 is grounded and a source of the MOSFET M2 is applied with the supply voltage $V_{DD}$.

R denotes a resistor for limiting a current supplied to the internal circuit.

M3 denotes an n-channel MOSFET and M4 denotes a p-channel MOSFET, both of which constitute a complementary MOS (CMOS) inverter for converting or adjusting the logic thresholds between the input circuit and the internal circuit.

Here, the MOSFETs M3 and M4 are composed of the MOSFET shown in FIG. 1, respectively, to ensure the high-speed operation of the inverter. If the MOSFETs of the internal circuits are composed of the MOSFET of FIG. 1, the ESD breakdown resistance of the MOSFETs of the protection circuit can be improved while keeping the high-speed operation of the internal circuits.

Second Embodiment

Figure 5:
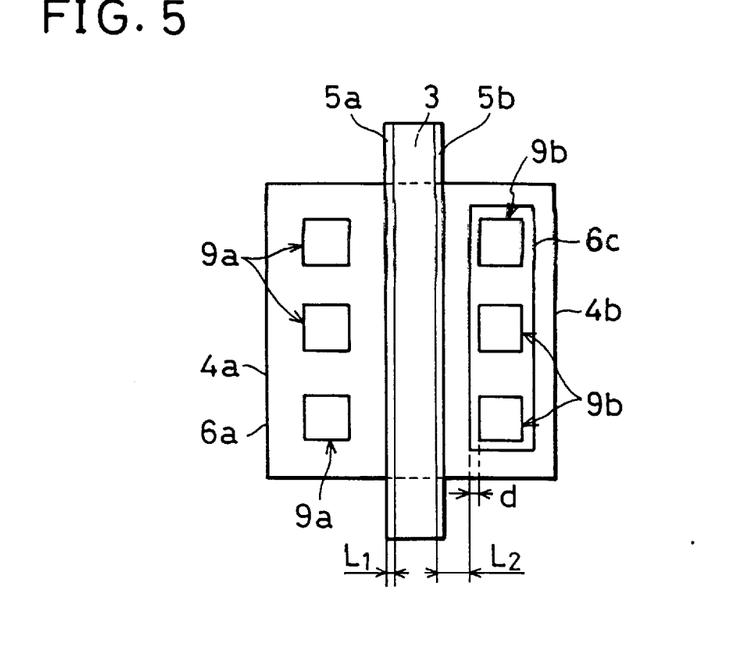
FIG. 5 is a partial plan view of a protection MOSFET of a semiconductor integrated circuit device according to a second embodiment of the invention.

FIG. 5 shows a protection MOSFET of a semiconductor integrated circuit device according toga second embodiment. This MOSFET is the same in structure as that of the first embodiment except for the $n_+$-diffusion region of the drain region. Therefore, the individual description is cancelled for the sake of simplification while adding the same reference numerals to the corresponding components.

As shown in FIG. 5, with the MOSFET of the second embodiment, an $n^+$-diffusion region 6c having an approximately rectangular plan shape is formed for the drain region instead of the island-like $n^+$-diffusion region 6b. It can be said that the region 6c is composed of one island-like part which is slightly wider than the contact holes 9b, and that the region 6c is commonly used for the three contact holes 9b.

The MOSFET of the second embodiment can provide the same effect or advantage as that of the first embodiment.

Third Embodiment

Figure 6:
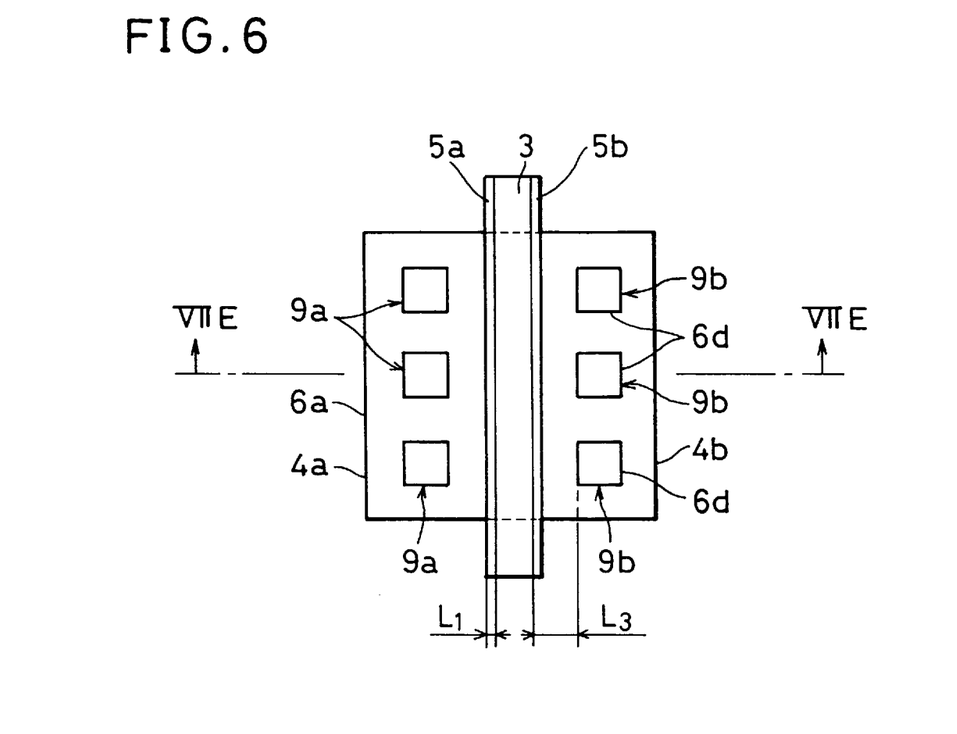
FIG. 6 is a partial plan view of a protection MOSFET of a semiconductor integrated circuit device according to a third embodiment of the invention.
Figure 7A:
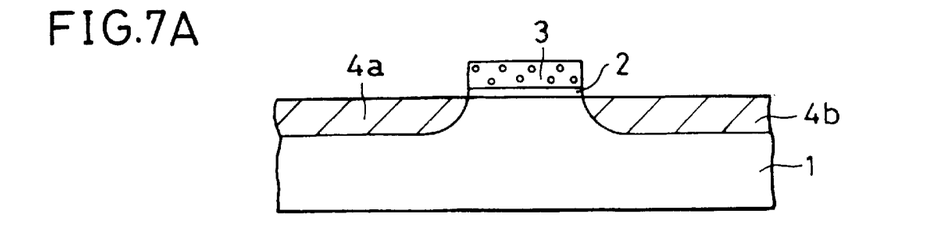
FIGS. 7A to 7E are partial cross-sectional views showing a fabrication method of the protection MOSFET of the semiconductor integrated circuit device according to the third embodiment, respectively.
Figure 7B:
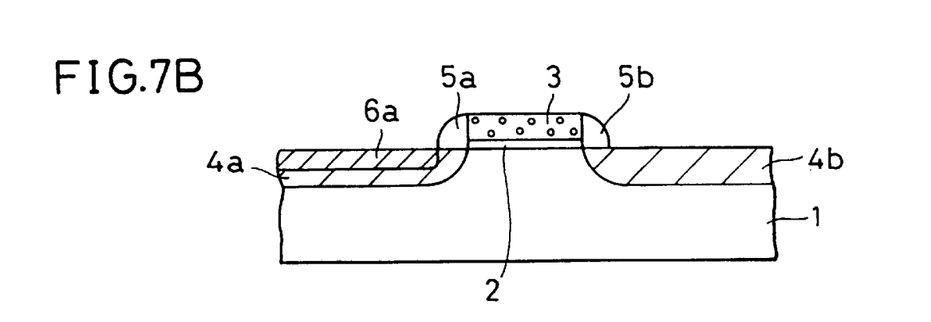
Figure 7C:
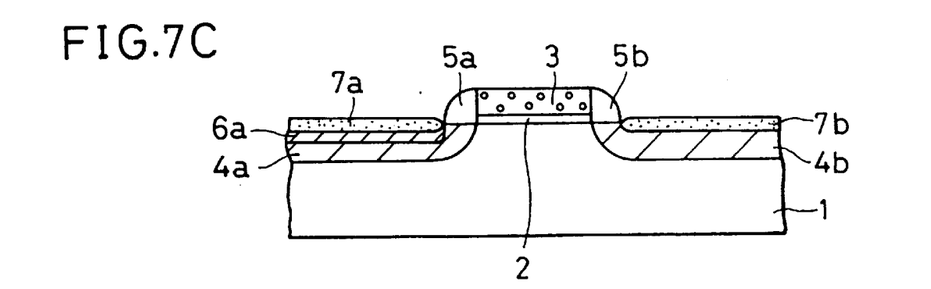
Figure 7D:
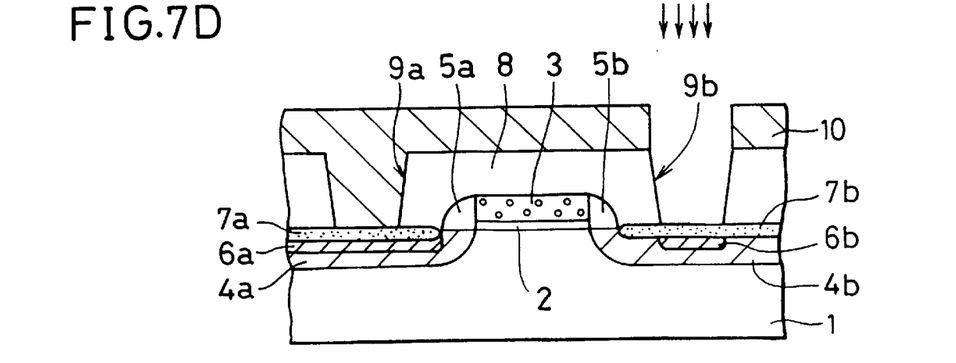
Figure 7E:
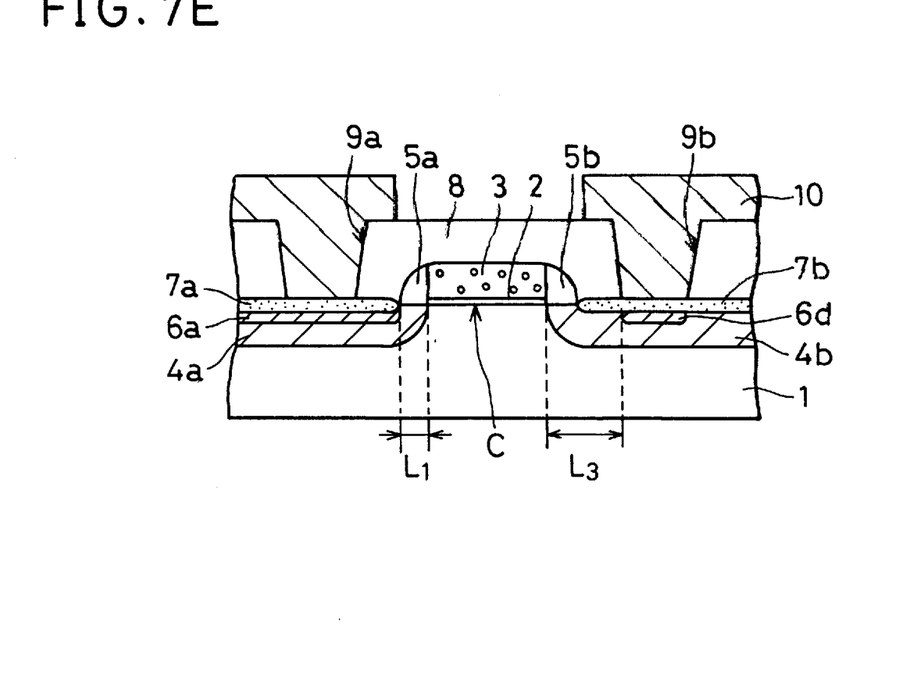

FIGS. 6 and 7E show an n-channel protection MOSFET of a semiconductor integrated circuit device according to a third embodiment.

As shown in FIGS. 6 and 7D, the MOSFET of the third embodiment is the same in structure as that of the first embodiment except for the $n^+$-diffusion region of the drain region. Therefore, the individual description is cancelled for the sake of simplification while adding the same reference numerals to the corresponding components.

As shown in FIG. 6, the MOSFET of the third embodiment has an $n^+$-diffusion region 6d on the $n^-$-diffusion region 4b instead of the $n^+$-diffusion region 6b. The region 6d is composed of three island-like parts each of which is substantially equal in plan shape and size to the corresponding one of the contact holes 9b. In other words, each island part of the region 6d has the size difference d that is substantially or nearly equal to zero, i.e., d≈0.

The distance from the drain-side end of the channel region to an opposing end of the $n^+$-diffusion region 6d is L3 that is longer than the distance L2 because d≈0. This increases the ESD breakdown resistance further compared with the first embodiment.

The semiconductor integrated circuit device of the third embodiment is fabricated by the following process steps.

First, as shown in FIG. 7A, the gate oxide layer 2, the gate electrode 3, the $n^-$-diffusion regions 4a and 4b and the sidewall spacers 5a and 5b are formed in the same way as that of the first embodiment.

Next, a photoresist mask (not shown) is formed to cover the gate electrode 3, the sidewall spacers 5a and 5b and the $n^-$-diffusion regions 4a and 4b, and is patterned to have a window at a corresponding position to the diffusion region 4a. The diffusion region 4b is covered with the mask.

Then, arsenic ions are selectively implanted into only the $n^-$-diffusion region 4a at an acceleration energy of 50 to 70 keV with a dose of $5.0 \times 10^{14}$ to $1.0 \times 10^{16}$ atoms/cm$^2$ using the patterned photoresist mask. Thus, the $n^+$-diffusion region 6a is formed in the $n^-$-diffusion region 4a in self-alignment with the gate electrode 3 and the sidewall spacer 5a, as shown in FIG. 7B.

The $n^+$-diffusion region 6a is placed on the approximately entire diffusion region 4a. The $n^+$-diffusion region 6d is not formed at this stage.

Subsequently, a titanium film is selectively deposited on the $n^+$-diffusion region 6a and the $n^-$-diffusion region 4b and then, the film is subjected to heat treatment. Thus, the silicide layers 7a and 7b made of TiSi$_2$ are formed on the regions 6a and 4b, respectively, as shown in FIG. 7C. During this process, a TiSi$_2$ layer may be additionally formed on the gate electrode 3.

An insulator film made of BPSG or the like is deposited to cover the MOSFET by a CVD technique, and is patterned to have the contact holes 9a on the silicide layer 7a and the contact holes 9b on the silicide layer 7b, producing the patterned interlayer insulator film 8, as shown in FIG. 7D.

A photoresist mask 11 is formed on the interlayer insulator film 8 and is patterned to have windows at corresponding positions to the respective island-like parts of the diffusion region 4b. Arsenic ions (As) are selectively implanted into only the $n^-$-diffusion region 4b at an acceleration energy of 50 to 70 keV with a dose of $5.0 \times 10^{14}$ to $1.0 \times 10^{16}$ atoms/cm² using the patterned photoresist mask 11. Thus, the n⁺-diffusion region 6d is formed in the n⁻-diffusion region 4b, as shown in FIG. 7D.

Finally, after removing the photoresist film 11, a conductor film made of aluminum, aluminum alloy or the like is deposited on the patterned interlayer insulator film 8 by a sputtering technique. The conductor film is then patterned by a photolithography technique, forming the patterned interconnection film 10, as shown in FIGS. 7D and 6.

With the protection MOSFET of the third embodiment, although one photolithography process step is added, the distance L3 becomes longer than the distance L2, and as a result, a higher breakdown voltage can be obtained than the case of the first embodiment.

Fourth Embodiment

Figure 8:
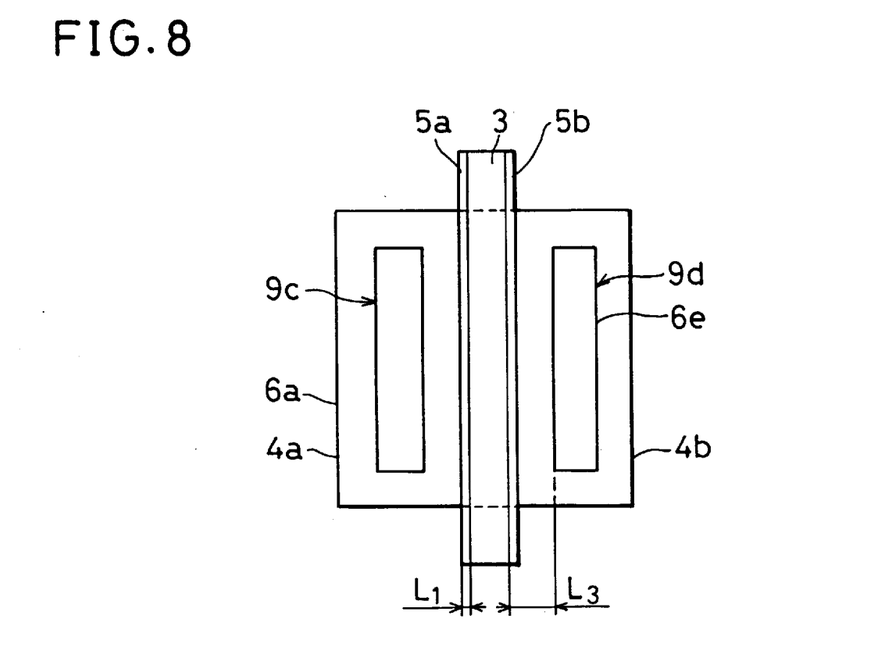
FIG. 8 is a partial plan view of a protection MOSFET of a semiconductor integrated circuit device according to a fourth embodiment of the invention.

FIG. 8 shows a protection MOSFET of a semiconductor integrated circuit device according to a fourth embodiment. This MOSFET is the same in structure as that of the third embodiment except for the contact holes and the n⁺-diffusion region of the drain region. Therefore, the individual description is cancelled for the sake of simplification while adding the same reference numerals to the corresponding components.

As shown in FIG. 8, with the MOSFET of the fourth embodiment, only one contact hole 9c is formed for the source region and only one contact hole 9d is formed for the drain region. The holes 9c and 9d each have a rectangular plan shape extending along the gate electrode 3. An n⁺-diffusion region 6e, which has a rectangular plan shape, is formed for the drain region instead of the island-like n⁺-diffusion region 6d of the third embodiment. It can be said that the region 6e is equivalent to that produced by connecting the island-like parts of the region 6d of the third embodiment with each other.

The MOSFET of the fourth embodiment can provide the same effect or advantage as that of the third embodiment.

In the first to fourth embodiments described above, although the n⁺-diffusion regions are shallower than the n⁻-diffusion regions, the n⁺-diffusion regions may be approximately the same in depth as the n⁻-diffusion regions, and the n⁺-diffusion regions may be deeper than the n⁻-diffusion regions.

Though n-channel MOSFETs are described in the above embodiments, the present invention can be applied to a p-channel MOSFET.

When the protection MOSFET of the invention is practically used, the gate is usually connected with the source or drain, as shown in FIG. 9.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. In a semiconductor integrated circuit device containing a protection MOSFET with an LDD structure, said protection MOSFET comprising:

a source region formed in a semiconductor substrate, said source region being made of a first lightly doped region and a first heavily doped region;

a drain region formed in said substrate, said drain region being made of a second lightly doped region and a second heavily doped region;

a channel region formed in said substrate between said source region and said drain region; and a first refractory-metal silicide layer formed on said first heavily doped region and a second refractory-metal silicide layer formed on said second heavily doped region;

said first lightly doped region being adjacent to a first end of said channel region, said second lightly doped region being adjacent to a second end of said channel region, said second end of said channel region being positioned on an opposite side to that of said first end, said first refractory-metal silicide layer covering an entirety of said first heavily doped region and said second refractory-metal silicide layer covering said second heavily doped region and an exposed part of said second lightly doped region, and a distance from said second end of said channel region to an opposing end of said second heavily doped region being longer than a distance from said first end of said channel region to an opposing end of said first heavily doped region.

2. In a semiconductor integrated circuit device containing a protection MOSFET with an LDD structure, said protection MOSFET comprising:

a source region formed in a semiconductor substrate, said source region being made of a first lightly doped region and a first heavily doped region;

a drain region formed in said substrate, said drain region being made of a second lightly doped region and a second heavily doped region; and a channel region formed in said substrate between said source region and said drain region;

said first lightly doped region being adjacent to a first end of said channel region, said second lightly doped region being adjacent to a second end of said channel region, said second end of said channel region being positioned on an opposite side to that of said first end, said second heavily doped region being composed of island-like parts, said parts being placed at positions corresponding to contact holes provided for said drain region, respectively, and a distance from said second end of said channel region to an opposing end of said second heavily doped region being longer than a distance from said first end of said channel region to an opposing end of said first heavily doped region.

3. The device as claimed in claim 2 wherein, a length of said island-like parts of said second heavily doped region in a direction parallel to said channel region is greater than that of said contact holes by a placement error value.

4. The device as claimed in claim 2 wherein, said island-like parts of said second heavily doped region have lengths equal to each other in a direction parallel to said channel region, and said contact holes have lengths equal to each other in said direction;

and wherein said lengths of said island-like parts are substantially equal to those of said contact holes.

5. The device as claimed in claim 2 wherein, said second heavily doped region is selectively formed to contain first positions and at least one second position intervening between said adjacent first positions, said first positions corresponding to said contact holes provided for said drain region, respectively.

6. In a semiconductor integrated circuit device containing a protection MOSFET with an LDD structure, said protection MOSFET comprising:

a source region formed in a semiconductor substrate, said source region being made of a first lightly doped region and a first heavily doped region;

a drain region formed in said substrate, said drain region being made of a second lightly doped region and a second heavily doped region;

a channel region formed in said substrate between said source region and said drain region;

said first lightly closed region being adjacent to a first end of said channel region, said second lightly doped region being adjacent to a second end of said channel region, said second end of said channel region being positioned on an opposite side to that of said first end, said second heavily doped region being selectively formed at a position corresponding to a contact hole provided for said drain region, a length of said second heavily doped region in a direction parallel to said channel region greater than that of said contact hole by a placement error value, and a distance from said second end of said channel region to an opposing end of said second heavily doped region being longer than a distance from said first end of said channel region to an opposing end of said first heavily doped region.

7. In a semiconductor integrated circuit device containing a protection MOSFET with an LDD structure, said protection MOSFET comprising:

a source region formed in a semiconductor substrates, said source region being made of a first lightly doped region and a first heavily doped region;

a drain region formed in said substrate, said drain region being made of a second lightly doped region and a second heavily doped region;

a channel region formed in said substrate between said source region and said drain region;

said first lightly doped region being adjacent to a first end of said channel region, said second lightly doped region being adjacent to a second end of said channel region, said second end of said channel region being positioned on an opposite side to that of said first end, said second heavily doped region being selectively formed at a position corresponding to a contact hole provided for said drain region, a distance from said second end of said channel region to an opposing end of said second heavily doped region being longer than a distance from said first end of said channel region to an opposing end of said first heavily doped region, and a length of said second heavily doped region in a direction parallel to said channel region being substantially equal to that of said contact hole.

8. A semiconductor integrated circuit device containing a protection MOSFET with an LDD structure, said MOSFET comprising:

a semiconductor substrate of a first conductivity type;
a gate oxide layer formed on said substrtate;
a gate electrode formed on said gate oxide layer;
a first sidewall spacer formed on said substrate adjacent to said gate electrode, said first sidewall spacer being disposed on one side of said gate electrode;
a second sidewall spacer formed on said substrate adjacent to said gate electrode, said second sidewall spacer being disposed on the other side of said gate electrode;

a first lightly doped region of a second conductivity type formed in said substrate, said second conductivity type being opposite in polarity to said first conductivity type;

said first lightly doped region being disposed on a side of said first sidewall spacer and extending to an opposing end of said gate electrode;

a first heavily doped region of said second conductivity type formed in said substrate;

said first heavily doped region being disposed on said first lightly doped region and extending to an opposing end of said first sidewall spacer;

said first lightly doped region and said first heavily doped region constituting a source region of said MOSFET;

a second lightly doped region of said second conductivity type formed in said substrate;

said second lightly doped region being disposed on a side of said second sidewall spacer and extending to an opposing end of said gate electrode;

a second heavily doped region of said second conductivity type formed in said substrate;

said second heavily doped region being disposed on said second lightly doped region and not extending to an opposing end of said second sidewall spacer;

said second lightly doped region and said second heavily doped region constituting a drain region of said MOSFET;

a channel region formed in said substrate, said channel region being disposed under said gate oxide layer between said first lightly doped region and said second lightly doped region;

an interlayer insulator film formed over said substrate to cover said MOSFET, said interlayer insulator film having a first contact hole that exposes said first heavily doped region and a second contact hole that exposes said second heavily doped region; and a patterned interconnection film formed on said interlayer insulator film, said interconnection film being contacted with said first heavily doped region through said first contact hole and being contacted with said second heavily doped region through said second contact hole;

wherein a distance between opposing ends of said channel region and said second heavily doped region is longer than a distance between opposing ends of said channel region and said first heavily doped region.

9. The device as claimed in claim 8, further comprising a first refractory-metal silicide layer formed on said first heavily doped region and a second refractory-metal silicide layer formed on said second heavily doped region;

wherein said first refractory-metal silicide layer covers an entirety of said first heavily doped region and said second refractory-metal silicide layer covers said second heavily doped region.

10. The device as claimed in claim 8 wherein, said second heavily doped region is selectively formed at a position corresponding to said second contact hole.

11. The device as claimed in claim 8 wherein, said second heavily doped region is composed of island-like parts, and a plurality of said second contact holes are provided;

and wherein said parts being placed at positions corresponding to said second contact holes, respectively.

12. The device as claimed in claim 10 wherein, a length of said second heavily doped region in a direction parallel to said channel region is greater than that of said second contact hole by a placement error value.

13. The device as claimed in claim 11 wherein, a length of said island-like parts of said second heavily doped region in a direction parallel to said channel region is greater than that of said second contact hole by a placement error value.

14. The device as claimed in claim 10 wherein, a length of said second heavily doped region in a direction parallel to said channel region is substantially equal to that of said second contact hole.

15. The device as claimed in claim 11 wherein, said island-like parts of said second heavily doped region have lengths equal to each other in a direction parallel to said channel region, and said second contact holes have lengths equal to each other in said direction;

and wherein said lengths of said island-like parts are substantially equal to those of said second contact holes.

16. The device as claimed in claim 11 wherein, said second heavily doped region is selectively formed to contain first positions and at least one second position intervening between said adjacent first positions, said first positions corresponding to said second contact holes provided for said drain region, respectively.

* * * * *

UNITED STATES PATENT AND TRADEMARK OFFICE
CERTIFICATE OF CORRECTION

PATENT NO.: 5,856,693
DATED: January 5, 1999
INVENTOR(S): Hideaki ONISHI

It is certified that error appears in the above-identified patent and that said Letters Patent is hereby corrected as shown below:

Column 1, Line 24  delete "occur" first occurrence

Column 2, Line 51  delete "$V_{SD}$" and insert --$V_{SB}$--

Column 3, Line 4  delete "MOSFFT" and insert --MOSFET--

Column 5, Line 24  delete "has a" and insert --is--

Column 6, Line 66  delete "applied" and insert --supplied--

Column 7, Line 34  delete "applied" and insert --supplied--

Column 7, Line 36  delete "applied" and insert --supplied--

Column 7, Line 55  delete "toga" and insert --to a--

Column 7, Line 57  delete "$n_+$- diffusion" and insert --$n^+$- diffusion--

Signed and Sealed this

Eighth Day of June, 1999

Attest:

Q. TODD DICKINSON

*Attesting Officer*     *Acting Commissioner of Patents and Trademarks*